(12) United States Patent
Kosinski et al.

(10) Patent No.: US 7,889,025 B1
(45) Date of Patent: Feb. 15, 2011

(54) ANTI-REFLECTIVE ACOUSTIC DIFFUSER FOR SAW AND BAW DEVICES

(75) Inventors: John A. Kosinski, Neptune, NJ (US); Robert A. Pastore, Jr., Freehold, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 309 days.

(21) Appl. No.: 12/214,292

(22) Filed: Jun. 10, 2008

(51) Int. Cl.
*H03H 9/09* (2006.01)
*H03H 9/42* (2006.01)
*H03H 9/64* (2006.01)

(52) U.S. Cl. ............ 333/151; 333/153; 333/194; 333/195; 310/313 B

(58) Field of Classification Search ............ 333/141, 333/145, 150, 151, 153, 187, 193–195; 310/313 B, 310/313 D, 326
See application file for complete search history.

(56) References Cited

U.S. PATENT DOCUMENTS

| | | | | | |
|---|---|---|---|---|---|
| 4,267,534 | A | * | 5/1981 | Tanski | 333/153 |
| 4,336,514 | A | * | 6/1982 | Paige | 333/195 |
| 4,647,881 | A | * | 3/1987 | Mitsutsuka | 333/194 |
| 5,400,296 | A | * | 3/1995 | Cushman et al. | 367/1 |
| 6,420,202 | B1 | * | 7/2002 | Barber et al. | 438/52 |
| 7,230,511 | B2 | * | 6/2007 | Onishi et al. | 333/187 |

FOREIGN PATENT DOCUMENTS

| | | | |
|---|---|---|---|
| JP | 55-026723 | * | 2/1980 |
| JP | 56-056026 | * | 5/1981 |
| JP | 61-187412 | * | 8/1986 |
| JP | 08-148967 | * | 6/1996 |
| JP | 11-352529 | * | 12/1999 |

* cited by examiner

*Primary Examiner*—Barbara Summons
(74) *Attorney, Agent, or Firm*—Michael Zelenka; Stephen J. Harbulak

(57) ABSTRACT

An anti-reflective acoustic diffusion device is provided by a group of irregularly dimensioned diffusing elements positioned on an acoustic wave substrate end that diffuse the SAW and eliminate unwanted acoustic reflections from the end of the substrate. The irregularly dimensioned diffusing elements are substantially irregular in size, shape, composition, and location and provide the desired diffusion into a nearly uniform distributed acoustic energy with a random phase. The anti-reflective acoustic diffusion device can be used with SAW, BAW or multiple acoustic wave configurations. This invention also encompasses an anti-reflective acoustic diffusion system and methods for diffusing acoustic reflections with anti-reflective acoustic diffusing elements.

3 Claims, 3 Drawing Sheets

ANTI-REFLECTIVE ACOUSTIC DIFFUSER FOR SAW AND BAW DEVICES

GOVERNMENT INTEREST

The invention described herein may be manufactured, used, and licensed by or for the United States Government for governmental purposes without payment to us of any royalties thereon.

FIELD OF THE INVENTION

The present invention relates generally to the field of acoustic devices for electronic systems, and more particularly to acoustic diffusers for SAW and BAW devices.

BACKGROUND OF THE INVENTION

The Surface Acoustic Wave (SAW) is an acoustic wave that follows a smooth boundary plane, with elliptical particle motion which is greatest at the surface and drops off so rapidly with a depth that almost all energy is carried in a one-wavelength layer at the surface. The SAW is used as the basis for a variety of electronic devices including delay lines, filters, and correlators which are key components in numerous electronic applications. Radio frequency (RF) SAW filters have a number of desirable characteristics with respect to their size and cost along with their electronic properties such as insertion loss, bandwidth, transfer function, and so on. Numerous advances in this field have led to greatly improved SAW device reliability and performance, and RF SAW filters have found widespread application in modern mobile communications equipment such as cellular telephones.

The Bulk Acoustic Wave (BAW) is a longitudinal or transverse wave that travels through solids essentially without boundaries. For example, the wavefronts extend over many wavelengths in all directions. The BAW has also been used in numerous electronic devices.

One problem impeding the continued development of SAW and BAW devices is the proliferation of unwanted spurious reflections that frequently occur in such acoustic devices. The deleterious effects from such unwanted reflections include the presence of delayed echo signals in the output of SAW delay lines and filters, the support of additional unwanted resonances in both BAW and SAW devices, and the conversion of leaked energy into additional unwanted modes in both BAW and SAW devices. The prior art has only enjoyed limited success in solving these difficult problems; and it is useful to illustrate the problem of unwanted spurious reflections.

Referring now to the drawings, FIG. 1 depicts a rectangular parallelepiped SAW substrate 1 with a single interdigitated transducer (IDT) 2 on the major surface of the substrate. The IDT 2 generates a SAW 3 that propagates along the major surface of substrate 1. When SAW 3 reaches the end 4 of the substrate 1, a reflected wave 5 reflects back to the IDT 2. The reflected wave 5 produces the unwanted spurious signal with the undesirable consequence of delayed echo signals in the outputs of SAW delay lines and filters. In addition, during reflection, a portion of the energy may be transferred into another wave of a different type that also perturbs the intended operation of the SAW device. A similar situation can arise with BAW devices where energy leaking laterally can reach the edges of the BAW device, leading to reflected waves that may become standing waves and conversion to other modes.

One prior art approach is to attempt to eliminate edge reflections by placing a lossy acoustic absorbing material on the substrate. FIG. 2 illustrates that approach. SAW substrate 10 is a rectangular parallelepiped with a single IDT 11 that generates a SAW 12, which propagates toward the end 13 of substrate 10. The energy of SAW 12 is absorbed by the lossy materials 14 placed on the end of substrate 10, and the reflected wave is eliminated. The main drawback with this approach is that the lossy materials 14 are usually incompatible with the required hermetically-sealed packaging of SAW and BAW devices where low aging is a requirement.

A second prior art approach is to alter the shape of the substrate as shown in FIG. 3. Referring now to FIG. 3, substrate 20 with IDT 21 generates a SAW 22 that propagates to end 23. In this case, the substrate 20 is not a rectangular parallelepiped, but rather has an end 23 that is cut at an oblique angle 24 with respect to the propagation direction of SAW 22. When the SAW 22 reaches end 23 with its oblique angle 24, the reflected wave, represented by broken line arrow 25, propagates at an oblique angle that induces a reduced spurious signal level as it passes over the IDT 21. A main disadvantage of this prior art approach is that the unwanted reflection 25 is only redirected, not eliminated, and it is therefore inapplicable to many potential integrated acoustic electronic applications wherein multiple SAW devices are located near each other on the same major surface of a common substrate. Furthermore, both prior art approaches suffer from the serious disadvantage of being incompatible with today's integrated microelectronics fabrication techniques.

Thus, there has been a long-felt need for a new approach to eliminating or substantially reducing the ill effects of unwanted spurious reflections in SAW and BAW devices that does not suffer from the undesirable drawbacks, limitations and shortcomings associated with lossy materials, redirected reflections, and incompatibility with integrated microelectronics technology.

Until now, there is no currently available, simple, low-cost and effective anti-reflection technique that enhances satisfactory acoustic performance and also avoids the disadvantages, shortcomings, and limitations of prior art devices.

SUMMARY OF THE INVENTION

The present invention fulfills the long-felt need for a simple, low-cost and effective anti-reflection technique that does not suffer from the drawbacks, limitations, and shortcomings associated with lossy materials, redirected reflections, and incompatibility with integrated microelectronics with an anti-reflective acoustic diffusion apparatus for SAW and BAW devices comprising a pattern of acoustic diffusion elements advantageously placed on the end of a substrate to diffuse the reflected wave without generating any unwanted reflection from the end of the substrate. In accordance with the present invention, it is necessary that the diffusing elements be substantially irregular in size, shape, composition, and location to achieve the desired diffusion into a nearly uniform distributed acoustic energy with a random phase.

It is an object of this invention to provide an anti-reflective acoustic diffusion apparatus.

It is a further object of this invention to provide an anti-reflective diffusion apparatus for SAW and BAW devices that diffuses acoustic waves incident upon the diffuser from any arbitrary direction.

It is also an object of this invention to provide an anti-reflective acoustic diffusion apparatus for SAW and BAW devices with a pattern of diffusing elements positioned on an end of the substrate.

It is still another object of this invention to provide a simple, low-cost and effective anti-reflective acoustic diffusion system for SAW and BAW devices with a pattern of diffusing elements positioned on an end of the substrate that overcomes the prior art's undesirable drawbacks, limitations, and shortcomings associated with lossy materials, redirected reflections, and incompatibility with integrated microelectronics.

It is yet another object of this invention to provide methods for diffusing acoustic reflections with anti-reflective acoustic diffusing elements.

These and other objects are advantageously accomplished with the present invention providing an anti-reflective acoustic diffusion device comprising a group of irregularly dimensioned diffusing elements advantageously positioned on a SAW or BAW substrate end that diffuse the SAW and eliminate unwanted acoustic reflections from the end of the substrate. The term "irregularly dimensioned" means that the diffusing elements are substantially irregular in at least one of size, shape, composition, and location so that they provide the desired diffusion into a nearly uniform distributed acoustic energy with a random phase.

The present invention also encompasses an anti-reflective acoustic diffusion system and methods for diffusing acoustic reflections with anti-reflective acoustic diffusing elements.

DETAILED DESCRIPTION OF THE DRAWINGS

In accordance with the present invention a number of irregularly dimensioned diffusing elements are positioned on an end of the substrate to diffuse and scatter unwanted reflected waves away from the substrate in order to provide a simple, low-cost, and effective anti-reflective acoustic diffusion system that overcomes the prior art's undesirable drawbacks, limitations, and shortcomings associated with lossy materials, redirected reflections, and incompatibility with integrated microelectronics. The irregularly dimensioned diffusing elements are substantially irregular in at least one of size, shape, composition, and location and provide the desired diffusion into a nearly uniform distributed acoustic energy with a random phase independent of the direction from which the acoustic wave arrives at the diffusing elements.

Figure 1:
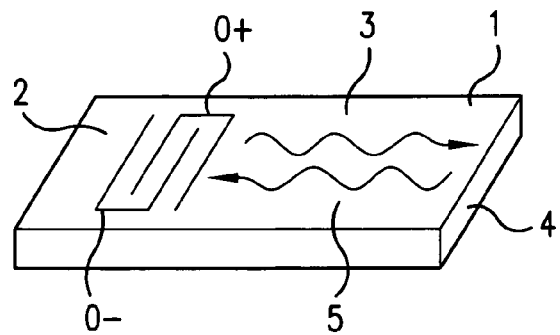
FIG. 1 is a perspective view of a rectangular parallelepiped SAW substrate illustrating the problem of reflected waves that cause spurious signals.
Figure 2:
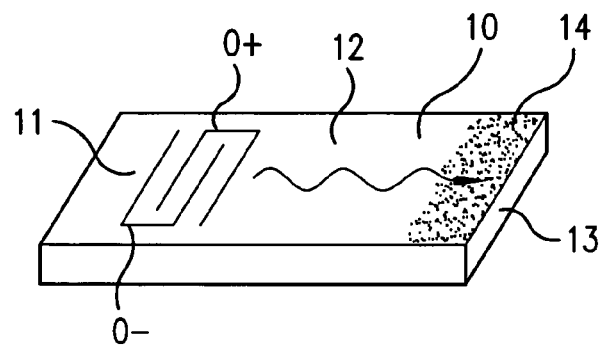
FIG. 2 is a perspective view of a rectangular parallelepiped SAW substrate depicting one prior art approach to eliminate the reflected waves that cause spurious signals.
Figure 3:
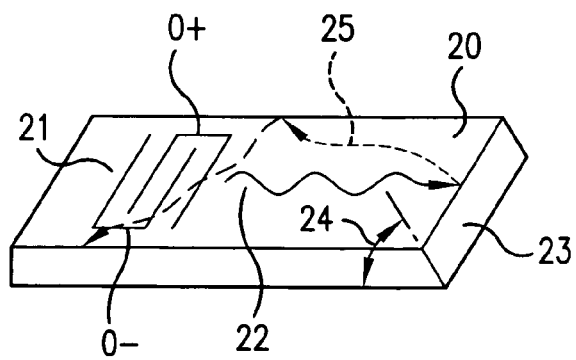
FIG. 3 is a perspective view of an SAW substrate depicting another prior art approach to eliminate the reflected waves that cause spurious signals.
Figure 4:
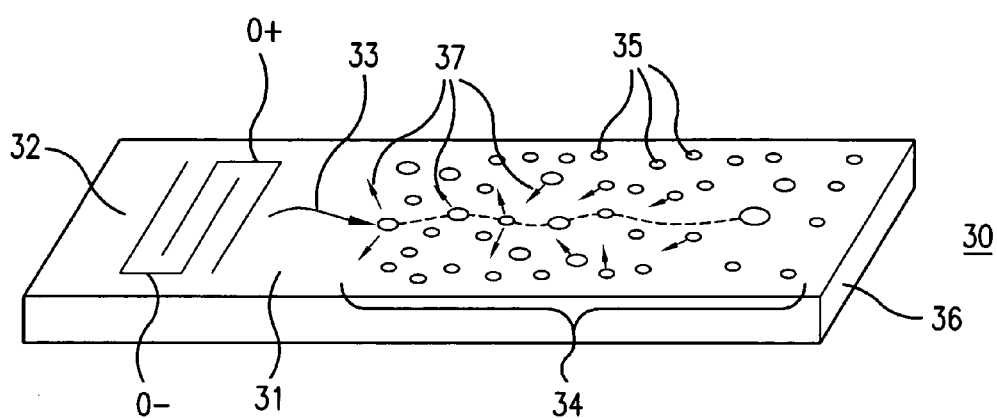
FIG. 4 is a perspective view depicting a simplified embodiment of the anti-reflective acoustic diffusion device in accordance with the present invention.

Referring now to the drawings, FIG. 4 is a perspective view of the first embodiment of this invention's anti-reflective acoustic diffusion device 30, comprising an SAW substrate 31 that hosts a single IDT 32 that generates an incident SAW 33. SAW 33 encounters an anti-reflective acoustic diffusion apparatus 34 further comprising a field of irregularly dimensioned diffusing elements 35 positioned on end 36. The SAW 33 is diffused, which causes scattered reflected waves, represented by small arrows 37, in such a way that there is no significant reflection from end 36. It is essential that the diffusing elements 35 be irregularly dimensioned in size, shape, composition, and location so that each of the scattered reflected waves 37 appear statistically random with respect to all the other scattered reflected waves 37. The net effect of this innovative arrangement is to diffuse the incident SAW 33 into nearly uniformly distributed, in angle, acoustic energy with random phase independent of the direction from which the acoustic wave arrives at the diffusing elements. In those cases when a SAW IDT generates both SAW and an unwanted BAW, the unwanted BAW is also advantageously diffused in accordance with the present invention. By achieving this nearly uniformly distributed, in angle, acoustic energy with random phase, it is expected that the SAW or BAW will provide advantageous performance characteristics such as elimination of delayed echo signals in SAW delay lines and filters, reduction of spurious resonances in BAW devices, and elimination of mode conversion at the edges of both BAW and SAW devices.

A distinct advantage of this invention's anti-reflective acoustic diffusion device 30 is its compatibility with integrated microelectronics. The drawings illustrating the reflected wave problem and prior art approaches allow a comparison between these approaches and this invention with respect to single, discrete, isolated SAW devices used as passive components with an unidentified external circuit. For the discrete device, the present invention provides a means of reducing the unwanted reflection using materials and processes that are compatible with hermetic sealing, but with the "penalty" of a somewhat increased substrate size. Generally speaking, this increased size penalty is relatively unimportant when the SAW device is formed as part of an RF integrated circuit ("RFIC") by, for example, depositing a piezoelectric thin film onto a semiconducting substrate. In such a case, there may be sufficient area at the end of the SAW device but above the ancillary circuitry such that the present invention may be formed without the size penalty. The distinct advantage here is that multiple SAW devices can then be formed on a given substrate and the anti-reflective acoustic diffusion device will provide both isolation of any given SAW device from acoustic waves generated by another SAW device on the same substrate and anti-reflection of acoustic waves traveling to the edges of the substrate. A multiple SAW embodiment is depicted in FIGS. 5 and 6.

Figure 5:
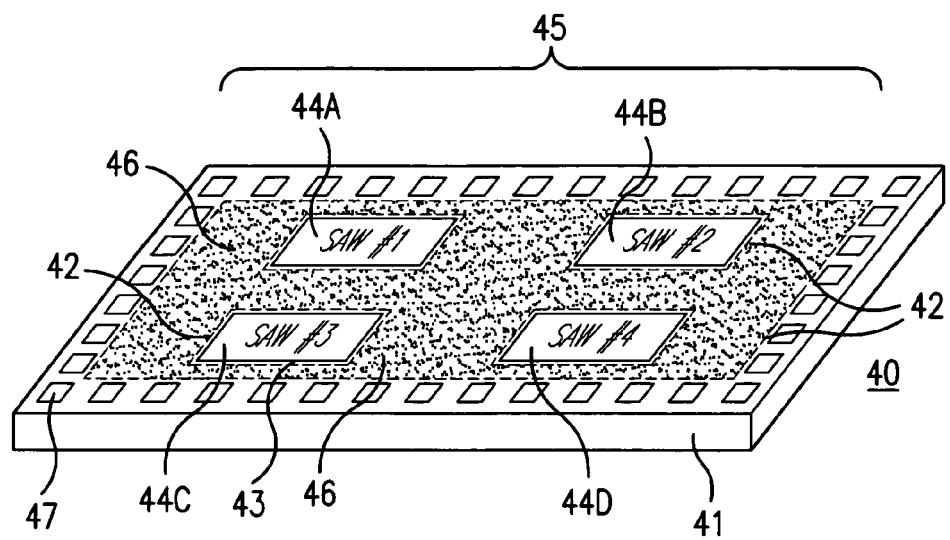
FIG. 5 is a perspective view depicting a multiple-SAW embodiment of the anti-reflective acoustic diffusion device in accordance with the present invention.
Figure 6:
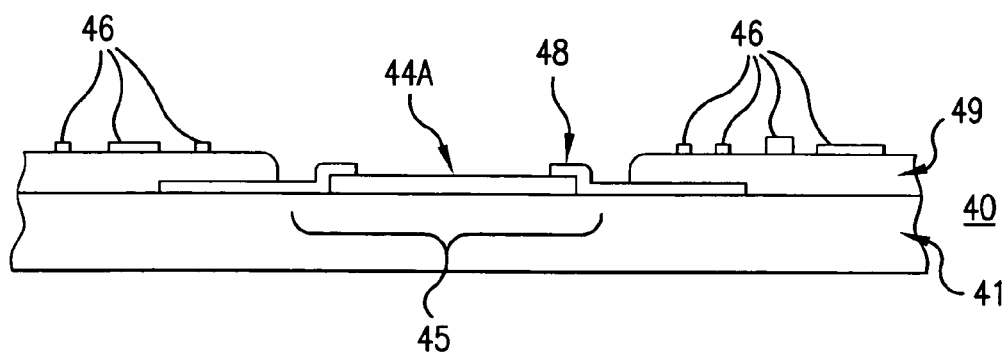
FIG. 6 is a partial side view depicting a portion of the multiple-SAW embodiment of the anti-reflective acoustic diffusion device in accordance with the present invention.

Referring now to the drawings, FIG. 5 is a perspective view depicting a multiple-SAW embodiment of an anti-reflective acoustic diffusion system 40, comprising a semiconducting substrate 41 with active circuitry in the regions between dashed lines 42, and planar regions 43, and without active circuitry in SAW devices 44A-44D, which have piezoelectric thin films deposited therein. The anti-reflective acoustic diffusion apparatus 45, further comprises a field of irregularly dimensioned diffusing elements 46 that are positioned on the unoccupied substrate regions between and surrounding the piezoelectric thin films, and SAW devices 44A-D, but they do not extend so far as to interfere with the external circuit connections made by bonding pads 47. The FIG. 6 partial side view, which uses the same numerals for like structures, illustrates SAW device 44A being connected to the active circuitry 49 by metallization regions 48. In this case, the anti-reflective acoustic diffusion apparatus 45 eliminates unwanted reflections from the edges of substrate 41 and discontinuity, as well as eliminating acoustic cross-talk from surface wave leakage.

The fundamental operating principle of the present invention is to diffuse the acoustic wave by creating a field of scattering elements that are as random as possible. Within the constraints of allowable fabrication technology, the variables that can be randomized include size, shape, location, and the reflectivity of each element. The elements may be formed as, for example, additional material deposited on the propagation surface, voids created by the removal of material from the propagation surface, or imposed variations in the properties of the propagation by perhaps ion bombardment. The potential materials that could be used to form the diffusing elements for conventional SAW and BAW devices, include metals of the same sort used for the electrodes such a aluminum, gold, or perhaps nickel. For integrated devices the potential materials include either a metal or perhaps an oxide or nitride of the types used for gate isolation and surface passivation of the integrated electronics. Optimum performance could be achieved by using all available dimensions of randomization. A lesser, but fully acceptable degree of performance should be available through a sufficient diffuser area even where a single fabrication step, such as etching, deposition or implantation, is used to fabricate the diffusing elements.

A number of variations are within the contemplation of the present invention. Although the drawings all depict planar propagation surfaces, the present invention may also be advantageously applied to eliminate edge reflections from untrapped transverse components in BAW devices. In the BAW case, the diffusion elements would be formed on the major surfaces of the BAW device in the region between the driving electrode and the edges of the device. Another application of the present invention is to eliminate or reduce plate mode reflections from the rear surfaces of SAW devices. In this case, an additional field of diffusion elements may be formed by suitable deposition, etching or other technique on the rear surface of the SAW substrate, and the diffusion elements will scatter BAW modes that are generated by the SAW transducers under certain circumstances. Numerous other possible applications include related areas of acoustic technology such as medical ultrasound and sonar.

It is to be further understood that other features and modifications to the foregoing detailed description of the anti-reflective acoustic diffusion device, system and methods are considered to be within the contemplation of the present invention, which is not limited by this detailed description. Those skilled in the art will readily appreciate that any number of configurations of the present invention and numerous modifications and combinations of materials, components, geometrical arrangements and dimensions can achieve the results described herein, without departing from the spirit and scope of this invention. Accordingly, the present invention should not be limited by the foregoing description, but only by the appended claims.

What we claim is:

1. An anti-reflective acoustic diffusion acoustic wave device, comprising:
    an acoustic wave substrate hosts at least one interdigitated transducer;
    said substrate having a surface with at least one end;
    an anti-reflective acoustic diffusion apparatus is positioned on said end;
    said transducer propagates an incident acoustic wave toward said diffusion apparatus;
    said diffusion apparatus further comprising a group of irregularly dimensioned diffusing elements being substantially irregular with respect to at least one of size, shape, composition, and location;
    said acoustic wave being diffused into a plurality of scattered reflected waves when encountering said diffusion apparatus; and
    said plurality of scattered reflected waves, having a nearly uniform distributed acoustic energy with a random phase, eliminate a plurality of unwanted acoustic reflections from said diffusion apparatus and an acoustic cross-talk from a surface wave leakage to allow an improved acoustic wave device performance without any increase in the size of said substrate;
    each of said plurality of scattered waves being statistically random with respect to each other;
    said diffusion apparatus providing both an isolation of any given SAW device from acoustic waves generated by another SAW device on the same substrate and an anti-reflection;
    the anti-reflective acoustic diffusion acoustic wave device further comprising:
    said at least one interdigitated transducer being a plurality of interdigitated transducers;
    said diffusion apparatus being positioned on a plurality of unoccupied substrate regions between and surrounding said plurality of interdigitated transducers;
    said plurality of unoccupied substrate regions allowing a plurality of unobstructed external circuit connections; and
    said plurality of interdigitated transducers being connected to said plurality of external connections by a plurality of metallization regions;
    the anti-reflective acoustic diffusion acoustic wave device further comprising:
    said acoustic wave being a surface acoustic wave propagated by a surface acoustic wave device; and
    said plurality of scattered reflected waves being primarily a plurality of surface acoustic waves; and
    the anti-reflective acoustic diffusion acoustic wave device further comprising said plurality of scattered reflected waves including a plurality of bulk acoustic waves.

2. An anti-reflective acoustic diffusion system, comprising:
    an acoustic wave substrate hosts at least one interdigitated transducer;
    said acoustic wave substrate having a surface with at least one end;
    an anti-reflective acoustic diffusion apparatus is positioned on said end;
    said transducer propagates an incident acoustic wave toward said diffusion apparatus;
    said diffusion apparatus further comprising a group of irregularly dimensioned diffusing elements being substantially irregular with respect to at least one of size, shape, composition, and location;
    said acoustic wave being diffused into a plurality of scattered reflected waves when encountering said diffusion apparatus; and
    said plurality of scattered reflected waves, having a nearly uniform distributed acoustic energy with a random phase, eliminate a plurality of unwanted acoustic reflections from said diffusion apparatus and an acoustic cross-talk from a surface wave leakage to allow an improved acoustic wave device performance without any increase in the size of said substrate;
    each of said plurality of scattered waves being statistically random with respect to each other;

the anti-reflective acoustic diffusion system further comprising said diffusion apparatus being compatible with integrated microelectronics manufacturing techniques;

the anti-reflective acoustic diffusion system further comprising said diffusion apparatus providing both an isolation of any given SAW device from acoustic waves generated by another SAW device on the same substrate and an anti-reflection;

the anti-reflective acoustic diffusion system further comprising:

said at least one interdigitated transducer being a plurality of interdigitated transducers;

said diffusion apparatus being positioned on a plurality of unoccupied substrate regions between and surrounding said plurality of interdigitated transducers;

said plurality of unoccupied substrate regions leaving a plurality of unobstructed external circuit connections; and said plurality of interdigitated transducers being connected to said plurality of external connections by a plurality of metallization regions; and the anti-reflective acoustic diffusion acoustic wave device further comprising:

said acoustic wave being a surface acoustic wave propagated by a surface acoustic wave device;

said plurality of scattered reflected waves being primarily a plurality of surface acoustic waves; and said plurality of scattered reflected waves including a plurality of bulk acoustic waves.

3. A method for diffusing acoustic reflections with anti-reflective acoustic diffusing elements in acoustic wave devices, comprising the steps of:

forming an acoustic wave substrate;

providing a surface with at least one end on said substrate;

hosting at least one interdigitated transducer on said substrate;

selecting a group of irregularly dimensioned diffusing elements that are substantially irregular with respect to at least one of size, shape, composition, and location;

positioning said group of diffusing elements in an anti-reflective acoustic diffusion apparatus on said end;

propagating an incident acoustic wave from said transducer toward said diffusion apparatus;

diffusing said acoustic wave into a plurality of scattered reflected waves when said acoustic wave encounters said diffusion apparatus; and providing said plurality of scattered reflected waves, having a nearly uniform distributed acoustic energy with a random phase, to eliminate a plurality of unwanted acoustic reflections from said diffusion apparatus and an acoustic cross-talk from a surface wave leakage to allow an improved acoustic wave device performance without any increase in the size of said substrate;

the method for diffusing acoustic reflections with anti-reflective acoustic diffusing elements in acoustic wave devices further comprising the step of diffusing each of said plurality of scattered waves in a statistically random manner with respect to each other;

the method further comprising the step of fabricating said devices to be compatible with integrated microelectronics manufacturing techniques;

the method further comprising the steps of providing an isolation of any given SAW device from acoustic waves generated by another SAW device on the same substrate and an anti-reflection with said diffusion apparatus;

the method for diffusing acoustic reflections with anti-reflective acoustic diffusing elements in acoustic wave devices, further comprising:

said at least one interdigitated transducer being a plurality of interdigitated transducers;

said diffusion apparatus being positioned on a plurality of unoccupied substrate regions between and surrounding said plurality of interdigitated transducers;

said plurality of unoccupied substrate regions leaving a plurality of external circuit connections unobstructed; and said plurality of interdigitated transducers being connected to said plurality of external connections by a plurality of metallization regions; and the method for diffusing acoustic reflections with anti-reflective acoustic diffusing elements in acoustic wave devices wherein:

said acoustic wave is a surface acoustic wave propagated by a surface acoustic device;

said plurality of scattered reflected waves are primarily a plurality of surface acoustic waves; and said plurality of scattered reflected waves including a plurality of bulk acoustic waves.

* * * * *